US007103193B2

(12) United States Patent
Croft, III

(10) Patent No.: US 7,103,193 B2
(45) Date of Patent: Sep. 5, 2006

(54) BANDPASS WOOFER ENCLOSURE WITH MULTIPLE ACOUSTIC FIBERS

(75) Inventor: James J. Croft, III, Poway, CA (US)

(73) Assignee: American Technology Corporation, San Diego, CA (US)

( * ) Notice: Subject to any disclaimer, the term of this patent is extended or adjusted under 35 U.S.C. 154(b) by 579 days.

(21) Appl. No.: 09/954,636

(22) Filed: Sep. 14, 2001

(65) Prior Publication Data

US 2002/0061114 A1 May 23, 2002

Related U.S. Application Data

(60) Provisional application No. 60/232,821, filed on Sep. 15, 2000.

(51) Int. Cl.
*H04R 1/02* (2006.01)
*H05K 5/00* (2006.01)

(52) U.S. Cl. ...................... 381/345; 381/335; 381/337; 381/338; 181/145

(58) Field of Classification Search ................ 381/335, 381/186, 89, 337, 338, 342, 345, 351, 163, 381/357, 180, 349, 350, 389, 71.4, 71.7, 381/FOR. 146; 181/163, 147, 156, 145, 181/160, 199, 144, 148

See application file for complete search history.

(56) References Cited

U.S. PATENT DOCUMENTS

| | | | | |
|---|---|---|---|---|
| 1,969,704 | A | 8/1934 | D'Alton | 181/160 |
| 2,689,016 | A | 9/1954 | Lang | 181/145 |
| 4,549,631 | A | 10/1985 | Bose | 181/155 |
| 4,875,546 | A | 10/1989 | Krnan | 181/160 |
| 4,924,963 | A | 5/1990 | Polk | 181/144 |
| 5,025,885 | A | 6/1991 | Froeschle | 181/156 |
| 5,092,424 | A * | 3/1992 | Schreiber et al. | 181/145 |
| 5,374,124 | A | 12/1994 | Edwards | 381/351 |
| 5,479,520 | A | 12/1995 | Nieuwendijk et al. | 381/353 |
| 5,629,502 | A * | 5/1997 | Nakano | 181/156 |
| 5,659,157 | A | 8/1997 | Shulte | 181/156 |
| 5,714,721 | A * | 2/1998 | Gawronski et al. | 181/156 |

(Continued)

FOREIGN PATENT DOCUMENTS

| | | |
|---|---|---|
| EP | 0 125 625 | 9/1984 |

(Continued)

OTHER PUBLICATIONS

"A Bandpass Loudspeaker Enclosure", Fincham, L. R., Presented at the 63rd Convention, May 15-18, 1979 Los Angeles.

*Primary Examiner*—Sinh Tran
*Assistant Examiner*—Brian Ensey
(74) *Attorney, Agent, or Firm*—Thorpe North & Western LLP

(57) ABSTRACT

A bandpass loudspeaker enclosure having three sub chambers, a first subchamber being a Helmholtz-reflex chamber with a passive acoustic radiator operating in parallel with the transducer, and the remaining two chambers utilizing two passive acoustic radiators to achieve three Helmholtz-reflex vent tunings and a multiple of low pass acoustic filters that provide an acoustic bandpass with reduced diaphragm displacement and substantially reduced distortion and pipe resonances above the pass band. A further embodiment provides a reduced lowest frequency vent size for a given low frequency subchamber size and tuning frequency.

27 Claims, 5 Drawing Sheets

U.S. PATENT DOCUMENTS 5,731,553 A 3/1998 Ledoux ...................... 181/156
5,749,433 A 5/1998 Jackson ...................... 181/156
6,169,811 B1 1/2001 Croft, III .................... 381/186
6,223,853 B1 5/2001 Huon et al. ................. 181/145
6,431,309 B1 * 8/2002 Coffin ........................ 181/156

FOREIGN PATENT DOCUMENTS

JP H2-260910 9/1990

* cited by examiner

BANDPASS WOOFER ENCLOSURE WITH MULTIPLE ACOUSTIC FIBERS

This application claims priority to patent application Ser. No. 09/505,553 filed on Feb. 17, 2000 and provisional patent application Ser. No. 60/232,821 filed on Sep. 15, 2000.

BACKGROUND OF THE INVENTION AND RELATED ART

This invention relates to improved, low frequency bandpass loudspeaker systems.

In the art of loudspeaker enclosures there are two basic types of systems that are most common. The sealed or acoustic suspension system, which consists of an electroacoustical transducer mounted in an enclosed volume that has the characterization of acoustic compliance. The second type is commonly called a bass-reflex system which includes an electroacoustic transducer mounted in an enclosure that utilizes a passive acoustic radiator or vent having the characteristic of acoustic mass which interacts with the characteristic acoustic compliance of the enclosure volume to form a Helmholtz resonance. A reflex system (enclosure/vent—compliance/mass) that exhibits a Helmholtz resonance shall be referred to hereinafter as a Helmholtz-reflex.

One of the prior art configurations relevant to the invention is the multi-chamber bandpass woofer system. Historically it has been shown that for a given restricted band of frequencies an acoustical bandpass enclosure system can produce greater performance both in terms of the efficiency/bass extension/enclosure size factor and large signal output compared to non-bandpass systems such as the basic sealed or bass reflex enclosures. The basic forms of these bandpass systems are discussed in the literature. See for example ‘A bandpass loudspeaker enclosure’ by L. R. Fincham, Audio Engineering Society convention preprint #1512, May.

The earliest patent reference to a “single” Helmholtz-reflex tuned bandpass woofer system is Lang, ‘Sound Reproducing System’ U.S. Pat. No. 2,689,016. This patent reference embodies the most common version of bandpass woofer system that is used in many systems today. This type of system includes an enclosure with two separate chambers with an active transducer mounted in a dividing panel separating and communicating to both chambers. One chamber is sealed, acting as an acoustic suspension and the other is ported, operating as a vented system with a passive acoustic mass communicating to the environment outside the enclosure.

The single tuned prior art bandpass woofer systems suffer from a number of shortcomings. First, they tend to have a series of resonant amplitude peaks that appear above the pass band of the bandpass system. These are due to standing waves in the enclosure chamber and are well documented in the article by Fincham listed above. Prior art solutions to this problem suggest the use of damping materials which unfortunately damp out useful system output at the same time they damp out the undesired resonances. Secondly, they have a cone excursion minimum at their Helmholtz-reflex frequency but there is only one tuning and it is placed at a frequency near the highest frequency of interest where cone excursion is insignificant compared to the lower frequency range of the system. If the vent tuning is placed at a lower, more useful frequency then the system suffers from reduced high frequency bandwidth.

The next evolutionary step in complexity of a prior art bandpass woofer is expressed in the earliest patent reference to a “dual” Helmholtz-reflex bandpass woofer system in FIG. 1 in D’Alton, ‘Acoustic Device’ U.S. Pat. No. 1,969,704. This reference discloses an enclosure containing a two chamber bandpass woofer system with an active transducer mounted in the dividing panel and communicating to both chambers. Each chamber has a passive acoustic radiator communicating to the environment outside the enclosure. European patent 0125625 ‘Loudspeaker enclosure with integrated acoustic bandpass filter’ by Bernhard Puls and U.S. Pat. No. 4,549,631 ‘Multiple porting loudspeaker systems’ granted to Amar G. Bose are derived from the same basic structure as shown in the D’Alton reference.

An alternative arrangement of a dual Helmholtz-reflex bandpass system is disclosed in the U.S. Pat. No. 4,875,546 ‘Loudspeaker with acoustic band-pass filter’ granted to Palo Krnan. This system includes an enclosure with two separate chambers with an active transducer mounted in the dividing panel there between and communicating to both chambers. One chamber is ported with a passive acoustic radiator communicating to the environment outside the enclosure. There is a second passive acoustic radiator communicating internally between the two chambers.

These dual tuned bandpass subwoofers suffer from the same out of band, high frequency chamber resonances that are endemic to the single tuned bandpass system. Further, by venting the lowest frequency chamber and tuning it to a lower frequency, the vent length tends to be longer and therefore produce vent/pipe resonances which can be quite audible as a distortion of the original signal.

U.S. Pat. No. 5,092,424 ‘Electroacoustical transducing with at least three cascaded subchambers’ granted to Schreiber et al. is an extension of the above listed bandpass art. It utilizes an enclosure with at least three chambers such that it is substantially equivalent to the Bose ’631 patent listed above, but with an additional enclosure volume added to the outside of the main enclosure. This additional enclosure receives the two ports from the internal main chambers and an additional passive acoustic radiator communicates to the environment outside the system. This system suffers from the same low frequency vent resonance problems as the dual tuned bandpass systems.

Each of the above patents have shortcomings that have limited the full potential of the bandpass approach for low frequency reproduction. In general, the above systems suffer from either a slow lowpass cutoff in the higher frequencies, where the greatest extension with the sharpest cutoff is most desirable, or unattenuated, higher frequency resonances which can cause audible distortion.

In a co-pending patent, the inventor eliminated vents from the low frequency chamber in multi chamber bandpass systems partially to avoid the pipe resonances that are generated from prior art bandpass systems with vented low frequency chambers. The inventor has found the shortcomings of prior art systems can be overcome by the novel vent/enclosure arrangement disclosed herein.

It would be desirable to have a woofer system that combined an extended frequency, steep slope lowpass characteristic at the high frequencies while at the same time having a Helmholtz-reflex tuning at the lowest frequency filtering out any resonance or distortion resulting from the lowest frequency passive acoustic radiator.

SUMMARY AND OBJECTS OF THE INVENTION

In the present invention a preferred embodiment provides a novel loudspeaker system incorporating an enclosure with a total of at least three subchambers and at least three Helmholtz-reflex tunings. The first of the multiple chambers operates as a Helmholtz-reflex, with an active transducer and a parallel passive acoustic radiator both feeding into and being filtered by the remaining subchambers operating as Helmholtz-reflex chambers providing a multiple low pass filter characteristic. The loudspeaker enclosure has at least two acoustic lowpass filters between the combined output of the (i) electroacoustic transducer and (ii) its parallel passive acoustic radiator and the outside environment.

Numerous features, objects and advantages of the invention will become apparent from the following specification when read in connection with the accompanying drawings.

DETAILED DESCRIPTION OF THE DRAWINGS AND PREFERRED EMBODIMENTS

The following preferred embodiments illustrate the present inventive principles and enable one of ordinary skill in the art to practice the invention as disclosed in embodiments set forth herein as well as in numerous equivalent forms. Components and elements of the respective embodiments having a common character are identified by common numerals for the sake of simplicity.

Figure 1:
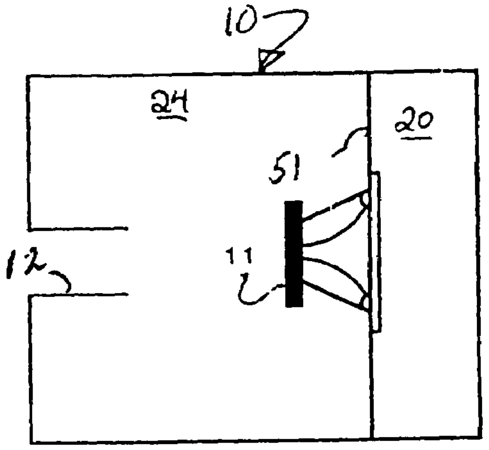
FIG. 1 (Prior Art)
FIG. 1 is graphic illustration of a prior art single reflex tuned bandpass enclosure.

FIG. 1 shows a prior art bandpass woofer system of U.S. Pat. No. 2,689,016, granted to Lang, in its simplest form with main enclosure 10 containing sub enclosure volumes 20 and 24 formed by divider 51 and transducer 11, with a passive acoustic energy radiator 12 venting sub enclosure volume 24 to the outside environment. This system has only one Helmholtz-reflex tuning frequency and has slow 12 db/octave stop band slopes and therefore must use lower crossover frequencies and larger, more costly satellite speakers that can play to a lower frequency without overload. Because of only one Helmholtz-reflex tuning frequency it only has one frequency of reduced cone motion. As shown in the above mentioned literature of Fincham this type of system also suffers from out of band resonances that can both color the sound and cause unintended directionality cues.

Figure 2:
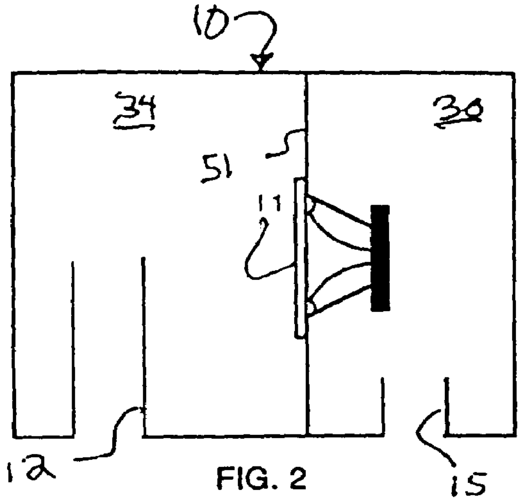
FIG. 2 (Prior Art)
FIG. 2 is graphic illustration of a prior art double reflex tuned bandpass enclosure.

FIG. 2 shows a prior art bandpass woofer system of the next level of complexity as shown in U.S. Pat. No. 4,549,631, granted to Bose. Main enclosure 10 contains sub enclosure volumes 30 and 34 with a passive acoustic energy radiator 12 venting sub enclosure volume 34 to the outside environment and passive acoustic energy radiator 15 vents sub enclosure volume 30 to the outside environment. With the two vent masses and the two subchamber compliances the system forms two Helmholtz-reflex tuning frequencies. Because both subchambers are Helmholtz-reflex systems the low frequency, high pass slope is steep and the high frequency, low pass slope is a shallow 12 dB/octave stop band. This is the opposite of the present invention in that it does not have the desirable 12 dB/octave high pass and steep slope low pass characteristics. As with the system in FIG. 1 this system also suffers from out of band resonances that can both color the sound and cause unintended directionality cues.

Figure 3:
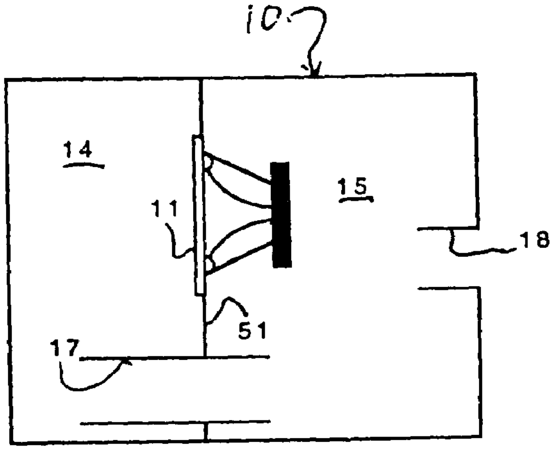
FIG. 3 (Prior Art)
FIG. 3 is graphic illustration of another prior art double reflex tuned bandpass enclosure.

FIG. 3 shows an alternative arrangement to FIG. 2 of a dual tuned bandpass system as is disclosed in the U.S. Pat. No. 4,875,546 Loudspeaker with acoustic band-pass filter' granted to Palo Krnan. This system includes an enclosure 10 with two separate chambers 14 and 15 with an active transducer 11 mounted in the dividing panel 51 and communicating to both chambers. One chamber 15 is ported with passive acoustic radiator 18 communicating to the environment outside the enclosure. There is a second passive acoustic radiator 17 communicating internally between the two chambers. This system suffers from many of the same disclosed shortcomings as that of FIG. 2.

Figure 4:
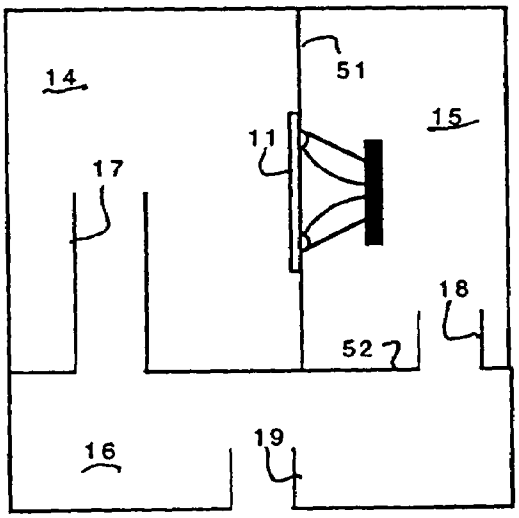
FIG. 4 (Prior Art)
FIG. 4 is graphic illustration of a prior art triple reflex tuned bandpass enclosure.

FIG. 4 shows a bandpass system, as disclosed in U.S. Pat. No. 5,092,424 Electroacoustical transducing with at least three cascaded subchambers' granted to Schreiber et al, that is the equivalent of that in FIG. 2 with addition of an additional subchamber 16 and vent 19 added to the output vents of the system in FIG. 2. This system has three subchambers, 14, 15, & 16 and three vents 17, 18, & 19 to provide three Helmholtz-reflex tunings, one from each chamber. As with the systems of FIGS. 2 and 3 this device suffers from unattenuated pipe resonances and significant passive acoustic radiator masses. The multiple acoustic low pass filtering of this system only filters the transducer, not the low frequency vent which generates the strongest pipe resonances.

Figure 5:
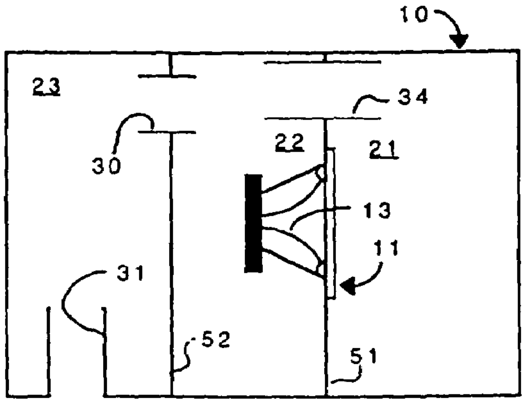
FIG. 5 illustrates a basic form of a preferred embodiment of the invention.

FIG. 5 shows a basic form of one embodiment of the invention. It illustrates a loudspeaker system comprising, at least one electroacoustical transducer 11 including a vibratable diaphragm 13 for converting an input electrical signal into a corresponding acoustic output signal. An enclosure 10 is divided into at least first subchamber 21, second subchamber 22 and third subchamber 23 by at least first dividing wall 51 and second dividing wall 52. The first dividing wall 51 supports and coacts with the at least one electroacoustical transducer 11 to bound the first and the second subchambers 21 and 22. At least one passive acoustic radiator 30 is specifically designed to realize a predetermined acoustic mass and intercouples the second and third subchambers 22 and 23. At least one additional passive acoustic radiator 31 is specifically designed to realize a predetermined acoustic mass and intercouples the third subchamber to the region outside enclosure 10. At least one further additional passive acoustic radiator 34 is specifically designed to realize a predetermined acoustic mass and intercouples the first and second subchambers 21 and 22. Each of the passive acoustic radiators 30, 31 and 34 are specifically designed to realize predetermined acoustic mass and are shown here as elongated vents or ports. Other forms of passive acoustic radiators may also be used. Each of the three subchambers have the characterization of acoustic compliance. The acoustic radiators 30, 31 and 34 represent masses which interact with compliances of subchambers 21, 22 and 23 to form three Helmholtz-reflex tunings at three spaced frequencies in the passband of the loudspeaker. These Helmholtz-reflex tunings also establish three spaced frequencies in the passband of the loudspeaker system at which the deflection characteristic of the vibratable diaphragm as a function of frequency has a minimum. In the invention the low pass slope is at least eighteen dB per octave and in the illustrated embodiment of FIG. 5 can operate at twenty four to thirty dB per octave.

The passive acoustic radiator 34 operates in parallel with the electroacoustical transducer 11, both bounding and intercoupling subchambers 21 and 22. Two multi-pole acoustic filters are formed by subchambers 21 and 22 and the associated passive acoustic radiators 30 and 31 to realize a low pass acoustic crossover characteristic to the output of both the transducer 11 and passive acoustic radiator 34. This is particularly important to the improved performance of the invention in that any undesirable pipe resonances generated by the passive acoustic radiator 34 are greatly attenuated compared to the prior art. Further, because of the acoustic masses in the exit path of the output of passive acoustic radiator 34 adding to the acoustic mass of passive acoustic radiator 34 the actual acoustic mass of passive acoustic radiator 34 can be less than that of the prior art.

The invention provides a method for acousti-mechanically configuring a low range speaker system for use in an audio system with the improvement of attenuating internal resonances and other unwanted output above an operating passband. This is accomplished by the steps of:

a) configuring the low range speaker system to include multiple, lowpass acoustic filter structures to achieve at least a third order acoustic low pass characteristic, and b) configuring a transducer with a vibratable diaphragm for which all output of the vibratable diaphragm that is delivered to the region outside the low range speaker system is filtered by all of the low pass acoustic filter structures.

In FIG. 5 those filter structures are expressed by subchambers 22 and 23 interacting with passive acoustic radiators 30 and 31. In a preferred alignment the low range speaker system shown in FIG. 5 is configured to have the low pass acoustic filter structures achieve at least a fourth order acoustic low pass characteristic. Also shown in FIG. 5 is the preferred embodiment including the further step of:

c) configuring a low frequency passive acoustic radiator to operate in parallel with and intercouple the same subchambers as the transducer such that the output of the passive acoustic radiator, shown here as an elongated vent or port, is also filtered by all of the low pass acoustic filter structures expressed by subchambers 22 and 23 interacting with passive acoustic radiators 30 and 31.

In a preferred embodiment this would have any output from a first side of the vibratable diaphragm 13 of transducer 11 output being filtered by the total number of acoustic filters in the system, not including the passive acoustic radiator 34, and the second side of the vibratable diaphragm 13 of transducer 11 output being delivered through passive acoustic radiator 34. That output would be filtered by the total number of acoustic filters in the path to outside of the enclosure 10 through passive acoustic radiator 31 from the output of passive acoustic radiator 34, which is the same path as that of the output of the first side of the vibratable diaphragm 13. This provides significant low pass filtering and therefore attenuation of any internal resonances and other unwanted output above an operating passband, a major source of which can be the pipe resonances of passive acoustic radiator 34. This configuration also achieves a filtering of any distortion that is generated from nonlinearities of transducer 11.

Another way to view this system is that of a standard bass reflex enclosure 21 with transducer 11 and a vent output 34, but with the inventive improvement being filtering the output of both the vent 34 and the transducer 11 by at least two subchambers 22 and 23 and two passive acoustic radiators 30 and 31.

The operation of the embodiment of FIG. 5 is illustrated by the following functional analysis. Starting at the highest frequency of interest, there is a high frequency non-Helmholtz-reflex resonance formed from the mass of the transducer diaphragm 13 resonating with the compliance of subchamber volume 22. At a frequency slightly lower there is a Helmholtz-reflex resonance dominated by the interaction of the mass of passive acoustic radiator 30 with the compliance of subchamber 22. Further down in frequency there is a non-Helmholtz-reflex resonance formed by the mass of transducer diaphragm 13 resonating with the combined compliance of subchambers 22 and 23 intercoupled by passive acoustic radiator 30. Still further down in frequency is a second Helmholtz-reflex resonance formed by the mass of passive acoustic radiator 31 and the combined compliance of subchambers 22 and 23. Still further down in frequency a non-Helmholtz-reflex resonance is formed by coupled mass of transducer diaphragm 13, subchambers 22 and 23, and passive acoustic radiators 30 and 31, all resonating with the compliance of subchamber 21. Still further down in frequency is a third Helmholtz-reflex resonance formed by the mass of passive acoustic radiator 34 and the compliance of subchambers 21. At this low frequency the acoustic masses of subchambers 22 and 23 combined with the acoustic masses of passive acoustic radiators 30 and 31 add to and supplement the acoustic mass of passive acoustic radiator 34 to create a large, composite acoustic mass interacting with subchamber 21. Below this frequency there is one last non-Helmholtz-reflex resonance wherein all of the above mentioned acoustic masses interact with the compliances of the suspension of the transducer 13 to form the fundamental resonance of the system.

There are a number of ways to reach a desired performance curve utilizing the acoustic topology of the invention. For most desired alignments there are some common elements of design. For example, it is desirable for subchamber 21 to be approximately equal or somewhat smaller than the combined volume of subchambers 22 and 23. The highest Helmholtz resonance frequency, set mostly by the mass of passive acoustic radiator 30 and the compliance of subchamber 22, should be 10 to 20 percent lower in frequency than the desired cutoff frequency of the system. Subchamber 22 should be less than one half the volume of subchamber 23 and in many alignments, less than one fourth. The tuning frequency of passive acoustic radiator 34 can be 60 to 80 percent of the free air resonance of the transducer 11. The tuning of passive acoustic radiator 31 set at a frequency about two times that of passive acoustic radiator 34. For maximum large signal capability this frequency may be lowered to a multiple of less than two to one in exchange for more passband ripple or reduced high frequency bandwidth. These parameters and those listed in the below example of a preferred embodiment may be varied to achieve the desired passband response which may depend on whether the system will have on-board power amplification or be operated as a passive system. One can adjust for the pass band shape desired using standard design principles known to one skilled in the art.

The following specifications are set forth for one preferred embodiment:

Subchamber 21 volume: 313 cu. in.
Subchamber 22 volume: 58 cu. in.
Subchamber 23 volume: 241 cu. in.
Vent 30 diameter: 1.1 in.
Vent 30 length: 2.25 in.
Vent 31 diameter: 2.12 in.
Vent 31 length: 6 in.
Vent 34 length: 9"
Vent 34 diameter: 1"
Transducer Qe: 0.39
Transducer Vas: 8 liters
Transducer Fs: 60 Hz
Helmholtz-reflex resonance of Vent 30 and subchamber 22: 165 Hz
Helmholtz-reflex resonance of Vent 31 and subchambers 22 and 23: 72 Hz
Helmholtz-reflex resonance of Vent 34 and subchambers 21: 35 Hz
High Pass −3 dB: 39 Hz
Low Pass −3 dB: 220 Hz It is generally considered in the loudspeaker art that a single subwoofer used in a multi-channel system must normally be crossed over at 120 Hz or lower to not have the high frequencies of the subwoofer start to interfere with the desired stereo separation and directionality of the presented sound field. One of the discoveries of the inventor is that while this is true of woofer systems with a standard lowpass characteristic of 12 or 18 dB per octave, the actual criteria for a subwoofer to not disturb directionality is for it to be down by at least 15 to 20 dB at 300 Hz. With standard lowpass slopes this requires a crossover point of no more than approximately 120 Hz. Even when the prior art approach of a steep electronic crossover slope is added to the lowpass slope of the woofer system the program signals are attenuated but the upper frequency (300 Hz or greater) distortion components that are not filtered out by the invented technique can still be substantial and therefore disturb the system directionality and aurally notify the listener of the subwoofer location.

Figure 6:
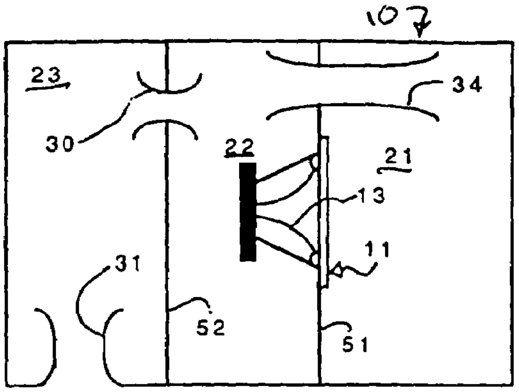
FIG. 6 provides a graphic version of the invention in FIG. 5 with flared vent structures.

Because of the effectiveness of the steep low pass characteristic of at least 18 dB per octave and 24–30 dB per octave in the FIG. 6 embodiment, the invented woofer system can be crossed over a frequencies of 200 Hz or higher while still avoiding listener localization. This is particularly valuable when combined with the extended low frequency response of the system which allows the development of deeper bass and/or equalized bass that provides exemplary performance for the enclosure size.

Further, because of the steep low pass slope, and therefore the ability to use crossover frequencies that are approximately an octave higher than with conventional subwoofers, the upper range speakers can be reduced to one eighth of there previous size and utilize transducers that are only one fourth the cone area. This ability to reduce the size of the upper range speakers when used with the invented woofer system can result in a reduction of 50% or more in the cost of the upper range speakers. This is a significant reduction in a two channel system, which can use one subwoofer and two upper range speakers, and a very significant cost reduction in a home theater system with surround sound that uses five or more channels of upper range speakers combined with a single subwoofer. This cost reduction in the upper range speakers is combined with the filtered distortion and pipe resonance reduction and extended low frequency response of the invention to create a surprising new level of system value.

The method that allows for acousto-mechanically configuring a low range speaker system for use in an audio system which enables reduction of speaker size requirements for upper range speaker systems when using said low range speaker system as a subwoofer includes the steps of:

a) configuring the low range speaker system to include multiple, low pass acoustic filter structures to achieve at least a third order acoustic low pass characteristic and more preferably a fourth order or greater low pass characteristic, and
b) configuring a transducer with a vibratable diaphragm to be filtered by the low pass acoustic filter structures, and
c) configuring a low frequency passive acoustic radiator operating in parallel with the transducer such that the passive acoustic radiator is filtered by the low pass acoustic filter structures.

FIG. 6 is the same invention as that of the FIG. 5 construction with the modification of passive acoustic radiators 30,31 and 34 all having flared ends. This can be important on one, two or all of the passive radiators to minimize turbulence and audible vent noise.

Figure 7:
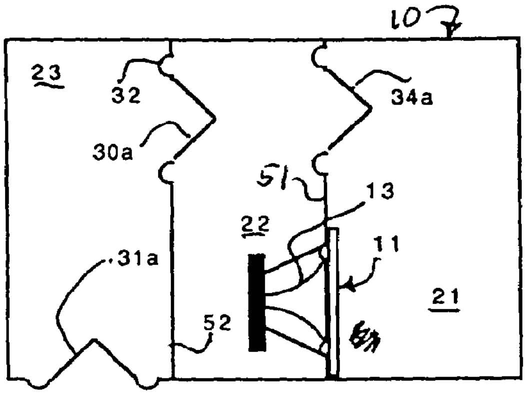
FIG. 7 shows the invention in FIG. 5 modified with passive acoustic diaphragms in place of vents.

FIG. 7 is essentially the invention of FIG. 5 but with passive acoustic diaphragms 30*a*, 31*a* and 34*a* substituting for the vents 30 and 31 of FIG. 5 as passive acoustic radiators. For best performance it can be important to have these passive diaphragm devices have low losses and high compliance in the surround/suspension 32 and also have the ability to maintain linearity while achieving substantial displacements that are equal to or preferably greater than that of the transducer 11. One could choose to use properly designed vents or passive diaphragms interchangeably in any of the passive acoustic radiators.

Figure 8:
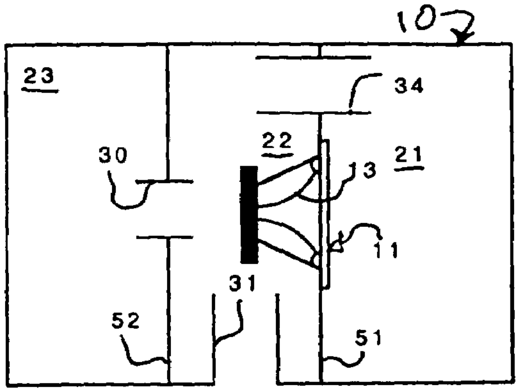
FIG. 8 illustrates another form of the invention with three subchambers and three vents.

FIG. 8 shows another embodiment that can achieve objectives of the invention differing in structure from that of FIG. 5 by the moving of passive acoustic radiator 31 such that it now intercouples the second subchamber 22 with the region outside enclosure 10. To understand the operation of this embodiment, in one preferred alignment, the first, uppermost Helmholtz-reflex resonance is generated by the acoustic mass of passive acoustic radiator 31 interacting with the acoustic compliance of subchamber 22. A second, lower frequency Helmholtz-reflex tuning is created from passive acoustic radiator 30 which effectively couples subchambers 22 and 23 to create a larger combined compliance which then interacts to create the lower tuning frequency.

Figure 9:
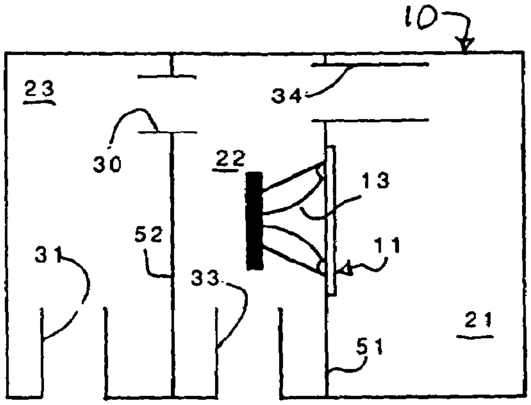
FIG. 9 depicts another form of the invention with three subchambers and four vents.

FIG. 9. also achieves objectives of the invention differing in structure from that of FIG. 5 by the addition of passive acoustic radiator 33 intercoupling second subchamber 22 to the region outside enclosure 10. In this case, the fourth passive acoustic radiator does not create a fourth Helmholtz reflex mode. The acoustic masses 30, 31, 33 and 34 and acoustic compliances 21, 22 and 23 are selected to establish three spaced frequencies in the passband of loudspeaker system at which there are Helmholtz-reflex tunings and the deflection characteristic of the vibratable diaphragm 13 as a function of frequency has a minimum. In one alignment of mass/compliance parameters, the system in FIG. 9 operates with the passive acoustic radiators 30, 31 and 33 all having the same acoustic mass and interacting with the acoustic compliance of subchambers 22 and 23 such that a first, highest Helmholtz-reflex frequency is established by passive acoustic radiator 30 efficiently coupling the two subchambers 22 and 23. This allows subchambers 22 and 23 to act as one large subchamber with passive acoustic radiators 31 and 33 operating in parallel and resonating with the large, virtual subchamber 22/23. At a frequency spaced apart and lower than the first higher frequency, the mass of passive acoustic radiator 31 resonates with the compliance of subchamber 22 to form a second Helmholtz-reflex mode. These two Helmholtz-reflex modes establish a multi-pole acoustic lowpass filter that has a stop band of at least 24 dB per octave. In one alignment of parameters to have the system function as described above, the subchambers 22 and 23 would be sized approximately in a 60%/40% (of the total subchamber 22 plus subchamber 23 volume) relationship respectively. Passive acoustic radiator 34 creates the lowest Helmholtz-reflex tuning frequency substantially the same as the embodiment shown in FIG. 5.

Figure 10:
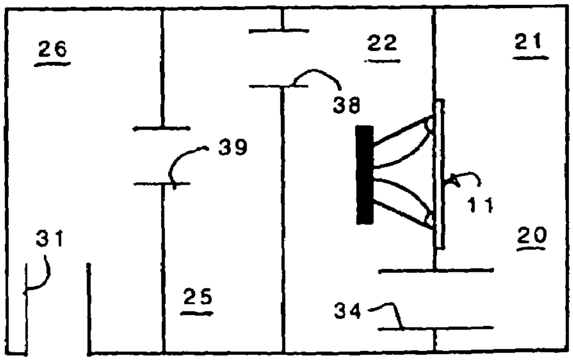
FIG. 10 shows another form of the invention with four subchambers and four, vents.

FIG. 10 is essentially the invented design of FIG. 5 with the addition of additional subchamber 26 and additional passive acoustic radiator 39 which is specifically designed to realize a predetermined acoustic mass. This elicits a four subchamber design with four Helmholtz-reflex tunings. While the three chamber version of the invention tends, with many preferred alignments, to have at least a fourth order low pass characteristic, the four subchamber, four Helmholtz-reflex tuning version of the invention with many preferred embodiments will have a substantially sixth order low pass characteristic.

Figure 11:
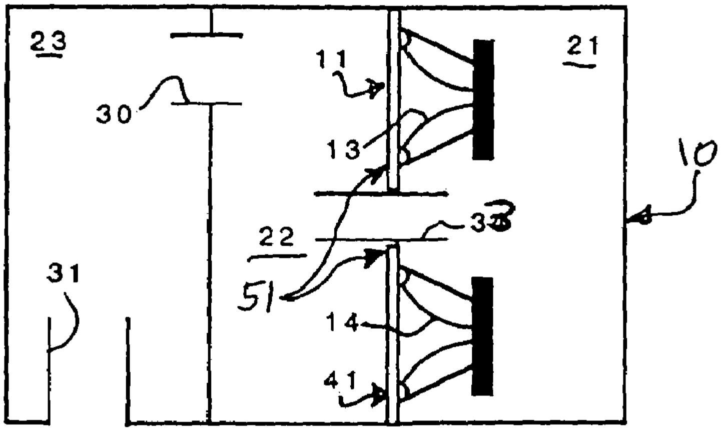
FIG. 11 illustrates the invention with multiple transducers in an acoustically parallel arrangement.
Figure 12:
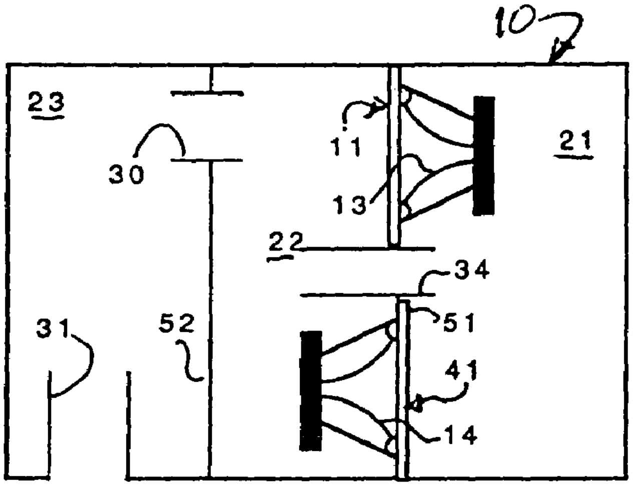
FIG. 12 shows the invention with multiple transducers in a parallel push-pull arrangement.
Figure 13:
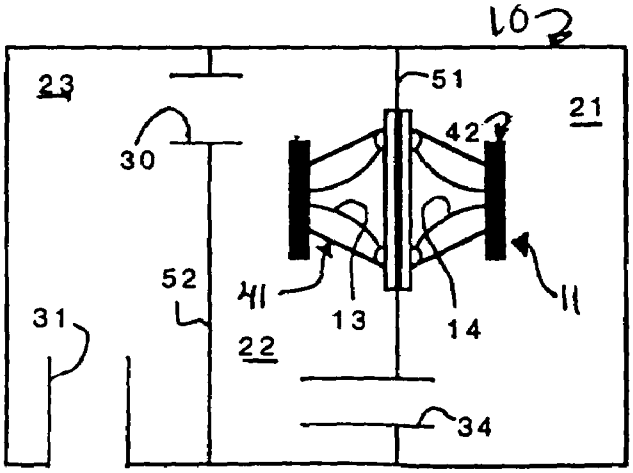
FIG. 13 shows the invention with multiple transducers in a push-pull arrangement.

FIGS. 11–13 illustrate that multiple transducers of two or more may be used to advantage with the invention. Some advantages are: synthesizing a virtual transducer of difficult to realize parameters, creating greater thermal capability with multiple voice coils, arranging push pull for cancellation of even order harmonic distortion, etc. Using two or more woofers can also provide compatibility with multi-channel systems without requiring summing electronics by having each of the electroacoustical transducers adapted to receive its electrical input signal from separate amplifier channels. For example, in a two channel system, one power amplifier channel could drive one transducer and the second subwoofer channel could drive a second transducer, both in the same enclosure as illustrated in the forgoing disclosure. Implementing such variations will be understood to those skilled in the art.

For example, FIG. 11 is the loudspeaker of FIG. 5 wherein a second transducer 41 of at least one electroacoustical transducer 11 is supported by and coacts with the first dividing wall 51 such that both electroacoustical transducers bound the first 21 and second 22 subchambers. In FIG. 1 the transducers are operating in a physically parallel arrangement and could be wired in either series or parallel.

FIG. 12 is the loudspeaker of FIG. 5 wherein a second transducer 41 is supported by and coacts with the first dividing wall 51 such that both electroacoustical transducers bound the first 21 and second 22 subchambers. Here the transducers are operating in a physically parallel, push-pull arrangement, are wired in opposite electrical phase, relationship to maintain in phase acoustic output, and have either in series or parallel electrical connection. This arrangement can be useful in canceling out asymmetrical, even order harmonic distortion caused by asymmetries in the mechanical suspensions or electrical fields.

FIG. 13 is the loudspeaker of FIG. 5 wherein a second 41 of the at least one electroacoustical transducer 11 is supported by and coacting with the first dividing wall 51 such that both electroacoustical transducers bound the first 21 and second 22 subchambers. Here the transducers are operating in a physical series or isobaric, push-pull arrangement and could be wired in either series or parallel and in opposite electrical phase relationship to maintain in phase acoustic output. This arrangement can have the same distortion reducing advantages as that of FIG. 12 while also simulating a driver that has difficult to achieve parameters such as twice the mass and twice the magnetic energy.

Figure 14A:
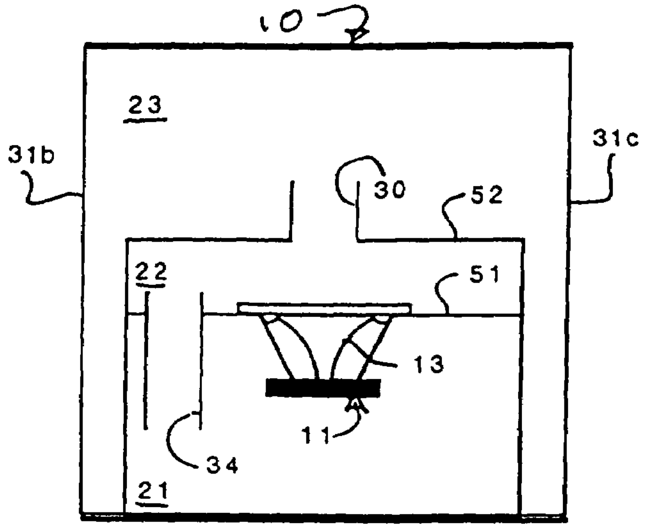
FIG. 14*a* shows the invention of FIG. 5 modified to include sheet material for the external passive acoustic radiator.

FIG. 14*a* is essentially the loudspeaker of FIG. 5 with outer sidewalls which bound the enclosure to the outside environment. The least one additional passive acoustic radiator 31*b* is comprised of at least one compliant sheet that intercouples the third subchamber 23 through at least one of the outer sidewalls to the region outside the enclosure. A second passive acoustic diaphragm 31*c* is shown on the opposite side of the enclosure. These passive diaphragms can be constructed of a compliant sheet material, such as polyester, rubber or vinyl. They are thickness dimensioned to have the same acoustic mass, as the vent 31 in FIG. 5, for a given tuning frequency and enclosure volume. Because of their large surface areas, they have a much smaller displacement requirement than the passive acoustic diaphragm 31*a* of FIG. 7, which also has an equivalent function in the invention. This diaphragm sheet maybe attached to one side of the enclosure and operate through a hole in the enclosure sidewall or it may actually be substantially the size of the entire sidewall. This sheet material may also cover more than one side. It may wrap around the enclosure and cover two, three, four or more sides of the enclosure. There may also be individual sheets placed on two opposing sides as shown. This construction of the invented loudspeaker can contribute to a very light weight version of the system and can achieve very low losses in the passive diaphragms 31*b*&31*c* due to their large surface areas. It may also be possible to make these diaphragms visually transparent.

Figure 14B:
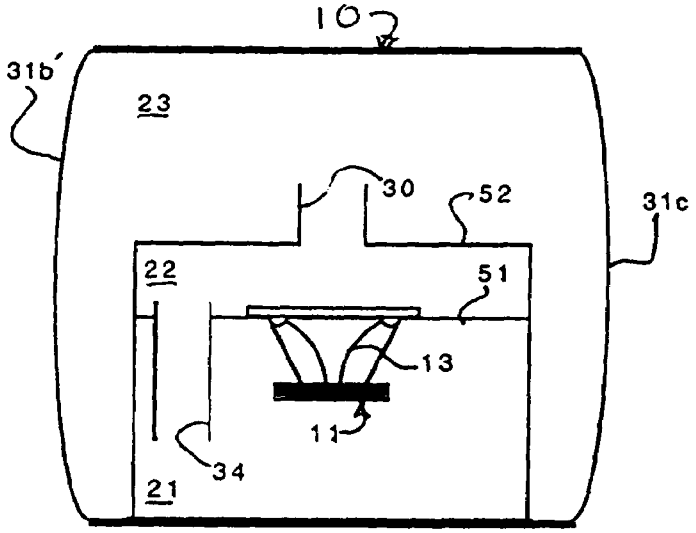
FIG. 14*b* shows the illustration of FIG. 14*a* modified to produce a positive output signal.

FIG. 14*b* shows the multiple passive acoustic diaphragm sheet radiators 31*b* making an outward excursion from the static position of 31*b*.

Figure 14C:
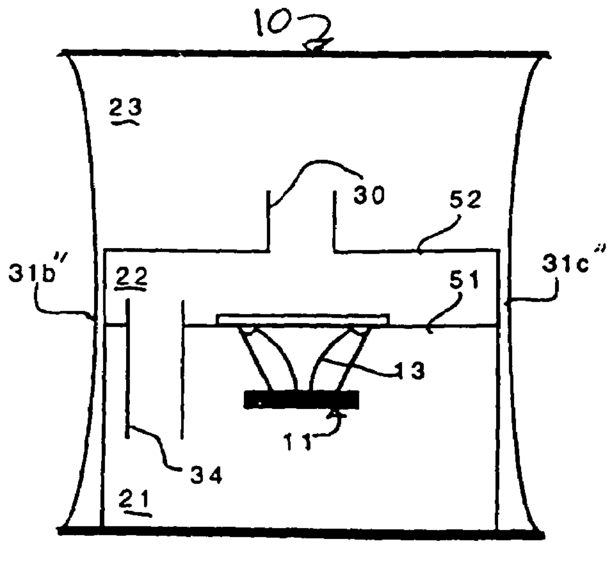
FIG. 14*c* shows the illustration of FIG. 14*a* modified to produce a negative output signal.

FIG. 14*c* shows the multiple passive acoustic diaphragm sheet radiators 31*b* making an inward excursion from the static position of 31*b*.

Figure 15:
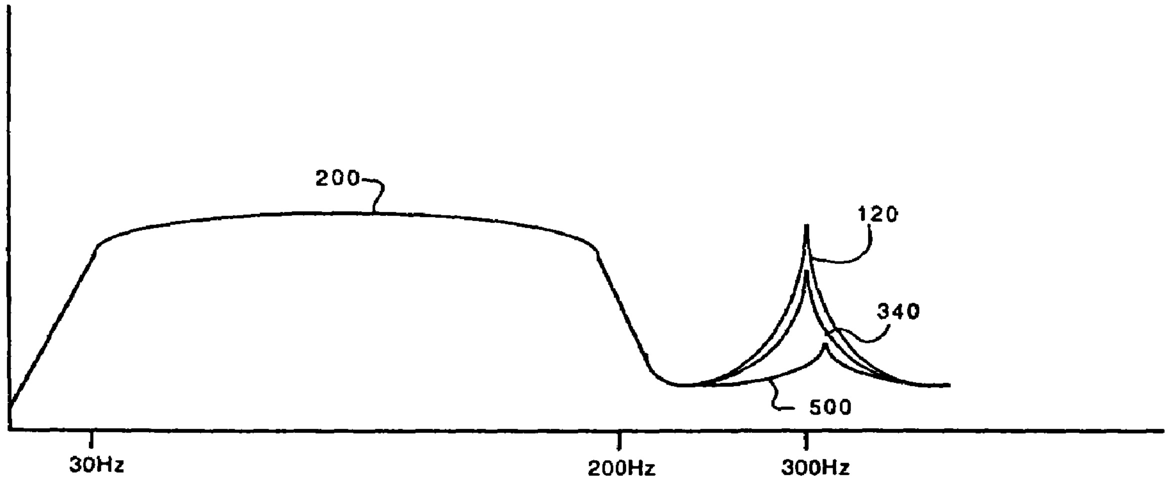
FIG. 15 compares pipe resonance amplitude of the prior art vs. the present invention.

The graph of FIG. 15 shows the relative out of band resonance performance of one embodiment of the invention in FIG. 5 represented by curve 500 and the prior art bandpass woofer systems of FIGS. 1 and 2 represented by curve 120 and the prior art bandpass woofer systems of FIGS. 3 and 4 represented by curve 340. These frequency response curves show the advantages of the invention in having substantially reduced amplitude peaks above the passband 200 compared to the four prior art bandpass systems. It can be seen that the resonant peak of curve 500 of the invention is both lower in amplitude and higher in frequency. This being due to the multiple filtering causing the lower amplitude and the higher frequency being due to shorter lowest frequency vent length of the invention. Because of the higher frequency resonance it is attenuated even more effectively by the low pass acoustic filters.

It is evident that those skilled in the art may make numerous other modifications of and departures from the specific apparatus and techniques herein disclosed without departing from the inventive concepts. Consequently, the invention is to be construed as embracing each and every novel feature and novel combination of features present in or possessed by the apparatus and techniques herein disclosed and limited solely by the spirit and scope of the appended claims.

The invention claimed is:

1. A loudspeaker system comprising:

at least one electroacoustical transducer for converting an input electrical signal into corresponding acoustic output;

an enclosure divided into at least first, second and third subchambers by at least first and second dividing walls;

said first dividing wall supporting and coacting with said at least one electroacoustical transducer to bound said first and said second subchambers, at least one passive acoustic radiator specifically designed to realize a predetermined acoustic mass and intercoupling said second and third subchambers;

at least a second passive acoustic radiator specifically designed to realize a predetermined acoustic mass and intercoupling at least one of said second and third subchambers with the region outside said enclosure;

at least a third passive acoustic radiator specifically designed to realize a predetermined acoustic mass and intercoupling said first and second subchambers;

each of said subchambers having the characterization of acoustic compliance;

said first and second passive acoustic radiator masses interacting with second and third subchamber compliances to form two Helmholtz-reflex tunings at two spaced frequencies in the passband of said loudspeaker;

said at least a third passive acoustic radiator intercoupling said first and second subchambers to form a third Helmholtz-reflex tuning at a frequency lower than that of said first and second passive acoustic radiators.

2. The loudspeaker of claim 1 wherein said passive acoustic radiators have the characteristic of acoustic mass and are selected from the group consisting of vents, ports, and suspended passive diaphragms.

3. The loudspeaker of claim 1 wherein said at least a second passive acoustic radiator intercouples said third subchamber with the region outside said enclosure.

4. The loudspeaker of claim 1 wherein said at least a second passive acoustic radiator intercouples said second subchamber with the region outside said enclosure.

5. The loudspeaker of claim 4 wherein at least a fourth passive acoustic radiator intercouples said third subchamber with the region outside said enclosure.

6. The loudspeaker of claim 1 wherein at least a second of said at least one electroacoustical transducer is supported by and coacts with said first dividing wall such that said electroacoustical transducers bound said first and said second subchambers.

7. The loudspeaker in claim 6 wherein said electroacoustical transducers are mounted in an mechanical-acoustical parallel arrangement.

8. The loudspeaker in claim 6 wherein said electro acoustical transducers are mounted in an mechanical-acoustical series arrangement.

9. The loudspeaker in claim 6, wherein said electroacoustical transducers are mounted in one of a) a mechanical-acoustical parallel arrangement and b) a mechanical-acoustical series arrangement, and wherein each of said electroacoustical transducers are adapted to receive said electrical input signal from separate amplifier channels.

10. The loudspeaker of claim 1 wherein:

said enclosure has outer side walls which bound said enclosure to the outside environment;

the enclosure further comprising a passive acoustic radiator comprising at least one compliant sheet that intercouples said third subchamber through at least one of said outer side walls to the region outside said enclosure.

11. The loudspeaker of claim 10 wherein said at least one compliant sheet intercouples said third subchamber through two of said outer side walls to the region outside said enclosure.

12. The loudspeaker of claim 10 wherein said at least one compliant sheet intercouples said third subchamber through three of said outer side walls to the region outside said enclosure.

13. The loudspeaker of claim 10 wherein said at least one compliant sheet intercouples said third subchamber through four of said outer side walls to the region outside said enclosure.

14. The loudspeaker of claim 10 wherein said at least one compliant sheet substantially forms at least one of the outer sidewalls.

15. The loudspeaker of claim 10 wherein said at least one compliant sheet substantially forms two of the outer sidewalls.

16. The loudspeaker of claim 10 wherein said at least one compliant sheet substantially forms three of the outer sidewalls.

17. The loudspeaker of claim 10 wherein said at least one compliant sheet substantially forms four of the outer sidewalls.

18. A loudspeaker system comprising: at least one electroacoustical transducer for converting an input electrical signal into corresponding acoustic output;

an enclosure divided into at least first, second, third, and fourth subchambers by at least first, second, and third dividing walls;

said first dividing wall supporting and coacting with said at least one electroacoustical transducer to bound said first and said second subchambers;

at least one passive acoustic radiator specifically designed to realize a predetermined acoustic mass and intercoupling said second and third subchambers;

at least a second passive acoustic radiator specifically designed to realize a predetermined acoustic mass and intercoupling at least one of said second, third, or fourth subchambers with the region outside said enclosure;

at least a third passive acoustic radiator specifically designed to realize a predetermined acoustic mass and intercoupling said first and second subchambers;

each of said subchambers having the characterization of acoustic compliance; said passive acoustic radiator masses interacting with first, second, third, and fourth subchamber compliances to form four Helmholtz-reflex tunings at four spaced frequencies in the passband of said loudspeaker.

19. The loudspeaker of claim 18 wherein said passive acoustic radiators have the characteristic of acoustic mass and are selected from the group consisting of vents, ports, and suspended passive diaphragms.

20. A loudspeaker system comprising:

at least one electroacoustical transducer for converting an input electrical signal into a corresponding acoustic output;

an enclosure divided into (n) number of subchambers by at least n−1 number of dividing walls with n =≧3;

a first dividing wall supporting and coacting with said at least one electroacoustical transducer to bound a first (n1) and a second (n2) subchamber;

at least one primary passive acoustic radiator designed to realize a predetermined acoustic mass and intercoupling said first (n1) and second (n2) subchambers;

at least one secondary passive acoustic radiator specifically designed to realize a predetermined acoustic mass and coupling each subchamber other than said first (n1) subchamber to another subchamber;

at least one tertiary passive acoustic radiator specifically designed to realize a predetermined acoustic mass and intercoupling at least one of said subchambers, other than said first (n1) subchamber, to the region outside said enclosure;

each of said subchambers having the characterization of acoustic compliance;

said passive acoustic radiator masses interacting with subchamber compliances to form a total of (n) Helmholtz-reflex acoustic filters, and wherein of the output of said at least one electroacoustic transducer and said at least one primary passive acoustic radiator must pass through at least n-1 of said acoustic filters before exiting the enclosure.

21. The loudspeaker of claim 20 wherein said passive acoustic radiators have the characteristic of acoustic mass and are selected from the group consisting of vents, ports, and suspended passive diaphragms.

22. A loudspeaker system comprising:

at least one electroacoustical transducer having a vibratable diaphragm for converting an input electrical signal into a corresponding acoustic output signal;

an enclosure divided into at least first, second and third subchambers by at least first and second dividing walls;

said first dividing wall supporting and coacting with said first electroacoustical transducer to bound said first and said second subchambers;

at least a first passive radiator specifically designed to realize a predetermined acoustic mass and intercoupling said second and third subchambers;

at least a second passive radiator specifically designed to realize a predetermined acoustic mass and intercoupling at least one of said second and third subchambers with the region outside said enclosure;

at least a third passive radiator specifically designed to realize a predetermined acoustic mass and intercoupling said first and second subchambers;

each of said subchambers characterized by acoustic compliance; said passive acoustic radiator masses and said acoustic compliances selected to establish three spaced frequencies in the passband of said loudspeaker system at which the deflection characteristic of said vibratable diaphragm as a function of frequency has a minimum.

23. The loudspeaker of claim 22 wherein each of said passive acoustic radiators has the characteristic of acoustic mass and is selected from the group consisting of vents, ports, and suspended passive diaphragms.

24. The loudspeaker of claim 23 further comprising a passive acoustic radiator that intercouples said third subchamber with the region outside said enclosure.

25. The loudspeaker of claim 10 further comprising a passive acoustic radiator that intercouples said third subchamber with the region outside said enclosure.

26. A loudspeaker system comprising:

at least one electroacoustical transducer having a vibratable diaphragm for converting an input electrical signal into a corresponding acoustic output signal;

an enclosure divided into at least first, second, third and fourth subchambers by at least first, second and third dividing walls;

said first dividing wall supporting and coacting with said at least one electroacoustical transducer to bound said first and said second subchambers;

at least one passive acoustic radiator specifically designed to realize a predetermined acoustic mass and intercoupling said second and third subchambers;

at least one additional passive acoustic radiator specifically designed to realize a predetermined acoustic mass and intercoupling said third and fourth subchambers;

at least a second additional passive acoustic radiator specifically designed to realize a predetermined acoustic mass and intercoupling at least one of said second, third, or fourth subchambers with the region outside said enclosure; at least a third additional passive acoustic radiator specifically designed to realize a predetermined acoustic mass and intercoupling said first and second subchambers;

each of said subchambers having the characterization of acoustic compliance;

said passive acoustic radiator masses and said acoustic compliances selected to also establish at least four spaced frequencies in a passband of said loudspeaker system at which the deflection characteristic of said vibratable diaphragm as a function of frequency has a minimum.

27. The loudspeaker of claim 26 wherein said passive acoustic radiator has the characteristic of acoustic mass and being selected from the group consisting of vents, ports, and suspended passive diaphragms.

* * * * *